(12) United States Patent
Rodder et al.

(10) Patent No.: US 9,236,444 B2
(45) Date of Patent: Jan. 12, 2016

(54) METHODS OF FABRICATING QUANTUM WELL FIELD EFFECT TRANSISTORS HAVING MULTIPLE DELTA DOPED LAYERS

(71) Applicant: Samsung Electronics Co., Ltd., Suwon-si (KR)

(72) Inventors: Mark S. Rodder, University Park, TX (US); Robert C. Bowen, Mount Laurel, NJ (US)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/947,239

(22) Filed: Jul. 22, 2013

(65) Prior Publication Data

US 2014/0329374 A1    Nov. 6, 2014

Related U.S. Application Data

(63) Continuation of application No. 61/819,266, filed on May 3, 2013.

(51) Int. Cl.
*H01L 29/66* (2006.01)
*H01L 29/78* (2006.01)

(52) U.S. Cl.
CPC .... *H01L 29/66469* (2013.01); *H01L 29/66795* (2013.01); *H01L 29/785* (2013.01)

(58) Field of Classification Search
CPC ............ H01L 29/66439; H01L 29/66462; H01L 29/66469; H01L 29/785; H01L 29/7782–29/7785; H01L 29/66795
USPC ...................................................... 438/478
See application file for complete search history.

(56) References Cited

U.S. PATENT DOCUMENTS 5,367,183 A * 11/1994 Perea et al. ................. 257/194
7,429,747 B2 * 9/2008 Hudait et al. ................. 257/14
8,283,653 B2 * 10/2012 Pillarisetty et al. .... B82Y 10/00
257/14

(Continued)

FOREIGN PATENT DOCUMENTS

JP        2003-324110        11/2003

OTHER PUBLICATIONS

E.F. Schubert, "Delta doping of III-V compound semiconductors: Fundamentals and device applications," J. Vac. Sci. Technol. A, May/Jun. 1990, pp. 2980-2996, vol. 8, No. 3.

(Continued)

*Primary Examiner* — Fernando L Toledo
*Assistant Examiner* — Christine L Hagan
(74) *Attorney, Agent, or Firm* — Myers Bigel Sibley & Sajovec, P.A.

(57) ABSTRACT

Methods of fabricating quantum well field effect transistors are provided. The methods may include forming a first barrier layer including a first delta doped layer on a quantum well layer and forming a second barrier layer including a second delta doped layer selectively on a portion of the first barrier layer in a first region of the substrate. The methods may also include patterning the first and second barrier layers and the quantum well layer to form a first quantum well channel structure in the first region and patterning the first barrier layer and the quantum well layer to form a second quantum well channel structure in a second region. The methods may further include forming a gate insulating layer on the first and second quantum well channel structures of the substrate and forming a gate electrode layer on the gate insulating layer.

20 Claims, 8 Drawing Sheets

(56) References Cited

U.S. PATENT DOCUMENTS

| | | | |
|---|---|---|---|
| 8,344,425 B2* | 1/2013 | Radosavljevic et al. | B82Y 10/00 257/200 |
| 8,575,596 B2* | 11/2013 | Pillarisetty et al. | B82Y 10/00 257/24 |
| 2003/0141518 A1* | 7/2003 | Yokogawa et al. | 257/194 |
| 2007/0138565 A1* | 6/2007 | Datta et al. | 257/369 |
| 2008/0157058 A1 | 7/2008 | Hudait et al. | |
| 2008/0265280 A1* | 10/2008 | Currie | H01L 21/823807 257/190 |
| 2008/0296556 A1 | 12/2008 | De Souza et al. | |
| 2008/0315256 A1* | 12/2008 | Ohta et al. | 257/194 |
| 2010/0148153 A1 | 6/2010 | Hudait et al. | |
| 2011/0068375 A1* | 3/2011 | Jakschik et al. | H01L 21/84 257/255 |
| 2011/0147711 A1* | 6/2011 | Pillarisetty et al. | 257/24 |
| 2011/0156004 A1 | 6/2011 | Radosavljevic et al. | |
| 2011/0207309 A1 | 8/2011 | Izumida et al. | |
| 2011/0297916 A1 | 12/2011 | Bennett et al. | |
| 2012/0032146 A1 | 2/2012 | Pillarisetty et al. | |

OTHER PUBLICATIONS

C.G. Fonstad, "SMA5111-Compound Semiconductors, Lecture Slide," May 1, 2013 (24 pages).

\* cited by examiner

METHODS OF FABRICATING QUANTUM WELL FIELD EFFECT TRANSISTORS HAVING MULTIPLE DELTA DOPED LAYERS

CLAIM OF PRIORITY

This U.S. non-provisional patent application claims priority under 35 U.S.C. §119(e) to U.S. Provisional Patent Application No. 61/819,266, filed on May 3, 2013, entitled "Multi-Vt FinFET Integration Using Stacked Delta-Doped Layers," the disclosure of which is hereby incorporated herein by reference in its entirety.

FIELD

The present disclosure generally relates to the field of electronics and, more particularly, to methods of forming integrated circuit devices.

BACKGROUND

Quantum well field effect transistors including group III and group V elements in channel regions may be used to improve device speed and to reduce power consumption because group III-V elements can have higher electron mobility than silicon. Quantum well field effect transistors may include delta doped layers that can contribute carriers to the channel regions.

Additionally, integrated circuit devices may need transistors with different threshold voltages. Accordingly, several technologies, including adjustment of channel doping concentrations and gate work functions, have been developed to implement transistors with different threshold voltages within one integrated circuit device. To adjust gate work functions, gate materials having different work functions and different channel materials may be used.

SUMMARY

A method of forming an integrated circuit device may include forming a first barrier layer including a first delta doped layer on a quantum well layer and forming a second barrier layer including a second delta doped layer selectively on a portion of the first barrier layer in a first region of the substrate. The method may also include patterning the first and second barrier layers and the quantum well layer to form a first quantum well channel structure in the first region and patterning the first barrier layer and the quantum well layer to form a second quantum well channel structure in a second region. The method may further include forming a gate insulating layer on the first and second quantum well channel structures of the substrate and forming a gate electrode layer on the gate insulating layer.

In various embodiments, forming the gate insulating layer may include forming the gate insulating layer covering portions of sides of the first and second quantum well channel structures.

According to various embodiments, forming the second barrier layer may include forming a preliminary second barrier layer including a preliminary second delta doped layer on the first barrier layer, forming an etch mask layer on the preliminary second barrier layer and exposing a portion of the preliminary second barrier layer in the second region of the substrate, and etching the portion of the preliminary second barrier layer until the preliminary second delta doped layer is removed.

In various embodiments, forming the first barrier layer and the preliminary second barrier layer may be performed through an in-situ deposition process.

In various embodiments, forming the second barrier layer may include forming a deposition mask layer on the first barrier layer and exposing the portion of the first barrier layer and forming the second barrier layer on the portion of the first barrier layer.

According to various embodiments, the first delta doped layer may include a first dopant and the second delta doped layer may include a second dopant, and a first dopant concentration may be different from a second dopant concentration.

According to various embodiments, the first delta doped layer may include a first dopant and the second delta doped layer may include a second dopant, and the first dopant and the second dopant may have different conductivity types.

In various embodiments, the method may also include forming a plurality of barrier layers including respective ones of a plurality of delta doped layers on the second barrier layer. The first and second quantum well structures may include some of the plurality of barrier layers.

According to various embodiments, the quantum well layer may include indium antimonide (InSb), indium gallium arsenide (InGaAs), indium arsenide (InAs), gallium arsenide (GaAs), gallium antimonide (GaSb) or indium gallium arsenide amtimonide (InGaAsSb).

According to various embodiments, the first and second barrier layers may include gallium arsenide (GaAs), aluminum arsenide (AlAs), aluminum gallium arsenide (AlGaAs), Indium phosphide (InP), aluminum antimonide (AlSb), aluminum indium antimonide (AlInSb), aluminum indium arsenide (AlInAs), aluminum gallium arsenide antimonide (AlGaAsSb), or aluminum indium arsenide antimonide (AlInAsSb).

In various embodiments, the first and second delta doped layers may include beryllium (Be), carbon (C), silicon (Si), sulfur (S) or tellurium (Te).

A method of forming an integrated circuit device may include forming a first quantum well channel structure on a substrate. The first quantum well channel structure may include a quantum well channel layer and a first plurality of barrier layers including respective ones of a first plurality of delta doped layers. The quantum well channel layer may include group III and group V elements and may extend between the first plurality of barrier layers and the substrate. The method may also include forming a second quantum well channel structure including the quantum well channel layer and a second plurality of barrier layers including respective ones of a second plurality of delta doped layers. The quantum well channel layer may extend between the second plurality of barrier layers and the substrate, and numbers of the barrier layers included in the first and second plurality of barrier layers may be different. The method may further include forming a gate insulating layer on the first and second quantum well channel structures and forming a gate electrode layer on the gate insulating layer.

In various embodiments, forming the gate insulating layer may include forming the gate insulating layer covering portions of sides of the first and second quantum well channel structures.

In various embodiments, two delta doped layers among the first plurality of delta doped layers may have different conductivity types.

According to various embodiments, the first plurality of delta doped layers may include respective ones of a plurality of dopants, and two delta doped layers among the first plurality of delta doped layers may have different dopant concentrations.

In various embodiments, some of the first plurality of barrier layers and some of the second plurality of barrier layers may be formed through an in-situ deposition process.

A method of forming an integrated circuit device may include forming a quantum well layer including group III and group V elements on a substrate and forming a first barrier layer including a first delta doped layer on the quantum well layer. The quantum well layer may extend between the substrate and the first delta doped layer. The method may also include forming a second barrier layer including a second delta doped layer on the first barrier layer. The method may further include patterning the first and second barrier layers and the quantum well layer to form a quantum well channel structure, forming a gate insulating layer on the quantum well channel structure and forming a gate electrode layer on the gate insulating layer.

According to various embodiments, forming the gate insulating layer may include forming the gate insulating layer covering a portion of a side of the quantum well channel structure.

In various embodiments, the first delta doped layer may include a first dopant and the second delta doped layer may include a second dopant. A first dopant concentration may be different from a second dopant concentration.

In various embodiments, the first delta doped layer may include a first dopant of a first conductivity type and the second delta doped layer may include a second dopant of a second conductivity type different from the first conductivity type.

DETAILED DESCRIPTION

Figure 1:
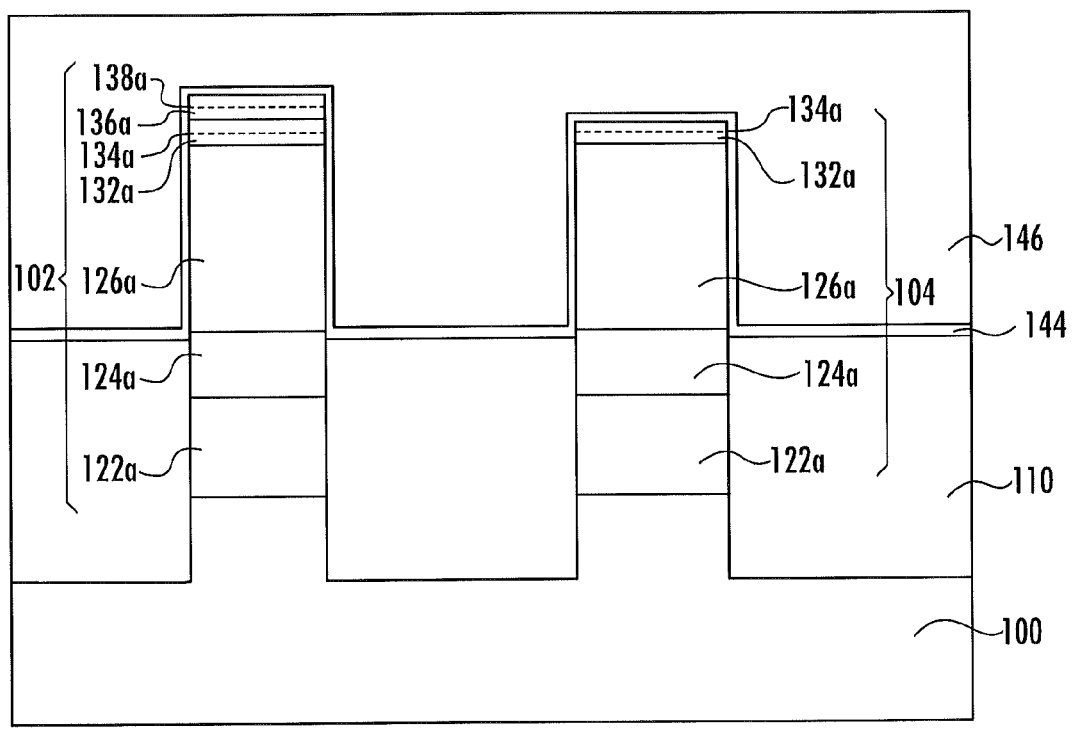
FIG. 1 is a cross sectional views of quantum well field effect transistors according to some embodiments of the present inventive concept.

Example embodiments of the inventive concept are described herein with reference to cross-sectional illustrations that are schematic illustrations of idealized embodiments and intermediate structures of example embodiments. As such, variations from the shapes of the illustrations as a result, for example, of manufacturing techniques and/or tolerances, are to be expected. Thus, example embodiments of the inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, integers, steps, operations, elements, and/or components, but do not preclude the presence or addition of one or more other features, integers, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may be interpreted accordingly.

It should also be noted that in some alternate implementations, operations noted in flowchart blocks herein may occur out of the order noted in the flowcharts. For example, two operations of two blocks shown in succession may in fact be executed substantially concurrently or the operations of blocks may sometimes be executed in the reverse order. Moreover, other blocks may be added or inserted between the blocks illustrated, and/or blocks may be omitted without departing from the scope of the present inventive concept.

FIG. 1 is a cross sectional views of quantum well field effect transistors according to some embodiments of the present inventive concept.

Referring to FIG. 1, first and second quantum well channel structures 102, 104 are on a substrate 100. While illustrated as the first and second quantum well channel structures 102, 104 are disposed directly adjacent to each other, the first and second quantum well channel structures 102, 104 may be in different regions of the substrate 100.

The substrate 100 may include one or more semiconductor materials such as, silicon (Si), germanium (Ge), silicon germanium (SiGe), gallium phosphide (GaP), gallium arsenide (GaAs), silicon carbide (SiC), silicon-germanium-carbon (SiGeC) or indium phosphide (InP). The substrate 100 may be, for example, a bulk silicon (Si) substrate or a bulk germanium (Ge) substrate. In some embodiments the substrate 100 may be a semiconductor on insulator configuration such as silicon on insulator (SOI) or germanium on insulator (GeOI) or SiGe on insulator (SiGeOI).

The first and second quantum well channel structures 102, 104 may be partially buried in an isolation layer 110 and thus may be channel structures included in fin-shaped field effect transistors (FinFET). Widths of the first and second quantum well channel structures 102, 104 may be in a range of about 5 nm to about 20 nm. The isolation layer 110 may be a shallow trench isolation (STI) and may include an insulating material such as, oxide.

The first and second quantum well channel structures 102, 104 include a quantum well layer pattern 126a including group III and group V elements on the substrate 100. The quantum well layer pattern 126a may have a sufficient thickness to provide adequate channel conductance to function as a channel region of a transistor. In some embodiments, the thickness of the quantum well layer pattern 126a may be in a range of about 10 nm to about 40 nm. The quantum well layer pattern 126a may include, for example, indium antimonide (InSb), indium gallium arsenide (InGaAs), indium arsenide (InAs), gallium arsenide (GaAs), gallium antimonide (GaSb) or indium gallium arsenide amtimonide (InGaAsSb).

The first quantum well channel structure 102 includes a first barrier layer pattern 132a including a first delta doped layer pattern 134a on the quantum well layer pattern 126a. The first quantum well channel structure 102 includes a second barrier layer pattern 136a including a second delta doped layer pattern 138a on the first barrier layer pattern 132a. The first and second barrier layer patterns 132a, 136a are vertically disposed on the same side of the quantum well layer pattern 126a (e.g., both the first and the second barrier layer patterns 132a, 136a above the the quantum well layer pattern 126a in FIG. 1). In some embodiments, the thickness of the quantum well layer pattern 126a may be 4 to 7 times greater than each of the first and second barrier layer patterns 132a, 136a.

The first and second barrier layer patterns 132a, 136a may include, for example, gallium arsenide (GaAs), aluminum arsenide (AlAs), aluminum gallium arsenide (AlGaAs), Indium phosphide (InP), aluminum antimonide (AlSb), aluminium indium antimonide (AlInSb), aluminum indium arsenide (AlInAs), aluminum gallium arsenide antimonide (AlGaAsSb) or aluminum indium arsenide antimonide (AlInAsSb). The first and second barrier layer patterns 132a, 136a may include different materials. In some embodiments, the first and second barrier layer patterns 132a, 136a may include same material.

The first and second delta doped layer patterns 134a, 138a may include dopants such as, for example, beryllium (Be), carbon (C), silicon (Si), sulfur (S) or tellurium (Te) according to the conductivity types of the first and second delta doped layer patterns 134a, 138a. The first and second delta doped layer patterns 134a, 138a may include first and second dopants respectively. The first and second dopants may be different elements. In some embodiments, the first and second dopants may be the same element. The first and second dopants may have the same conductivity type or different conductivity types. In some embodiments, a first dopant concentration of the first delta doped layer pattern 134a may be different from a second dopant concentration of the second delta doped layer pattern 138a. The first and second dopant concentrations may be in a range of about 1e12/cm2 to about 1e14/cm2. According to some embodiments, the first and second dopant concentrations may be the same.

The first and second dopants and the first and second dopant concentrations of the first and second delta doped layer patterns 134a, 138a may be predetermined according to a specified threshold voltage of a quantum well field effect transistor including the first quantum well channel structure 102.

The second quantum well channel structure 104 includes the first barrier layer pattern 132a but may not include the second barrier layer pattern 136a. Accordingly, quantum well field effect transistors including the first and second quantum well channel structures 102, 104 respectively may have different threshold voltages.

While the first and second barrier layer patterns 132a, 136a are illustrated as single layers respectively, the first and second barrier layer patterns 132a, 136a may include multiple barrier layer patterns including respective ones of delta doped layer patterns. For example, the first barrier layer patterns 132a may include a plurality of first barrier layer patterns and the second barrier layer patterns 136a may include a plurality of second barrier layer patterns. The plurality of first barrier layer patterns and the plurality of second barrier layer patterns may include different numbers of barrier layer patterns.

The number of barrier layer patterns in the plurality of first barrier layer patterns and the plurality of second barrier layer patterns, the first and second dopants, and the first and second dopant concentrations may be predetermined according to the specified threshold voltages of quantum well field effect transistors including the first and second quantum well channel structures 102, 104.

A gate insulating layer 144 and a gate electrode layer 146 may be disposed on the first and second quantum well channel structures 102, 104. The gate insulating layer 144 may cover portions of the first and second quantum well channel structures 102, 104 so that the first and second quantum well channel structures 102, 104 may provide channel structures of respective FinFETs. The first and second barrier layer patterns 132a, 136a are disposed between the quantum well layer pattern 126a and the gate insulating layer 144 at an uppermost portion of the first quantum well channel structure 102.

The gate insulating layer 144 may include a high-k material having a higher dielectric constant than a silicon oxide film such as, for example, aluminum oxide (Al2O3), hafnium oxide (HfO2), lanthanum oxide, (La2O3), zirconium oxide, (ZrO2) or tantalum oxide (Ta2O5). The gate insulating layer 144 may conformally cover the portions of the first and second quantum well channel structures 102, 104.

The gate electrode layer 146 may include a single layer. Alternatively, the gate electrode layer 146 may include two or more layers. In some embodiments, a first layer of the gate electrode layer 146 may include, for example, one of titanium nitride (TiN), tantalum nitride (TaN), titanium carbide (TiC) and tantalum carbide (TaC) and a second layer may include, for example, tungsten (W) or aluminum (Al).

According to some embodiments, the first and second quantum well channel structures 102, 104 may include a nucleation and buffer layer pattern 122a and a barrier layer pattern 124a between the substrate 100 and the quantum well layer pattern 126a. The nucleation and buffer layer pattern 122a may include, for example, SiGe or GaAs. The nucleation layer may create an anti-phase domain-free virtual polar substrate, and the buffer layer may provide dislocation filtering buffer that can provide compressive strain for the first and second quantum well channel structures 102, 104 and can control a lattice mismatch between the substrate 100 and the barrier layer pattern 124a. The barrier layer pattern 124a may include a material having a higher band gap than that of the material included in the overlying quantum well layer pattern 126a. The barrier layer pattern 124a may include, for example, SiGe, GaAs, or AlGaAs.

Figure 2:
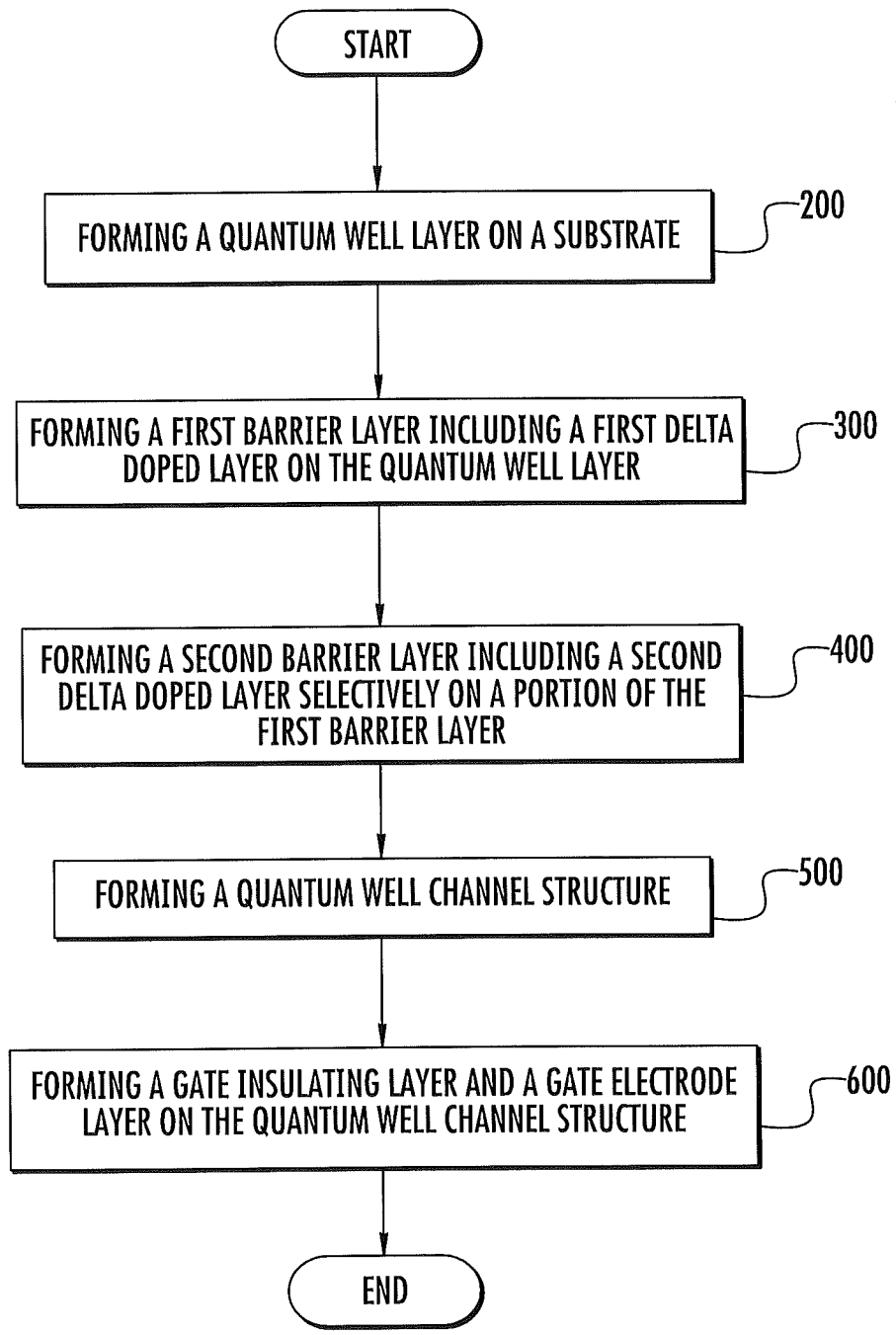
FIGS. 2 and 3 are flow charts illustrating a method of fabricating quantum well field effect transistors according to some embodiments of the present inventive concept.

FIG. 2 is a flow chart illustrating a method of fabricating quantum well field effect transistors according to some embodiments of the present inventive concept.

Figure 4:
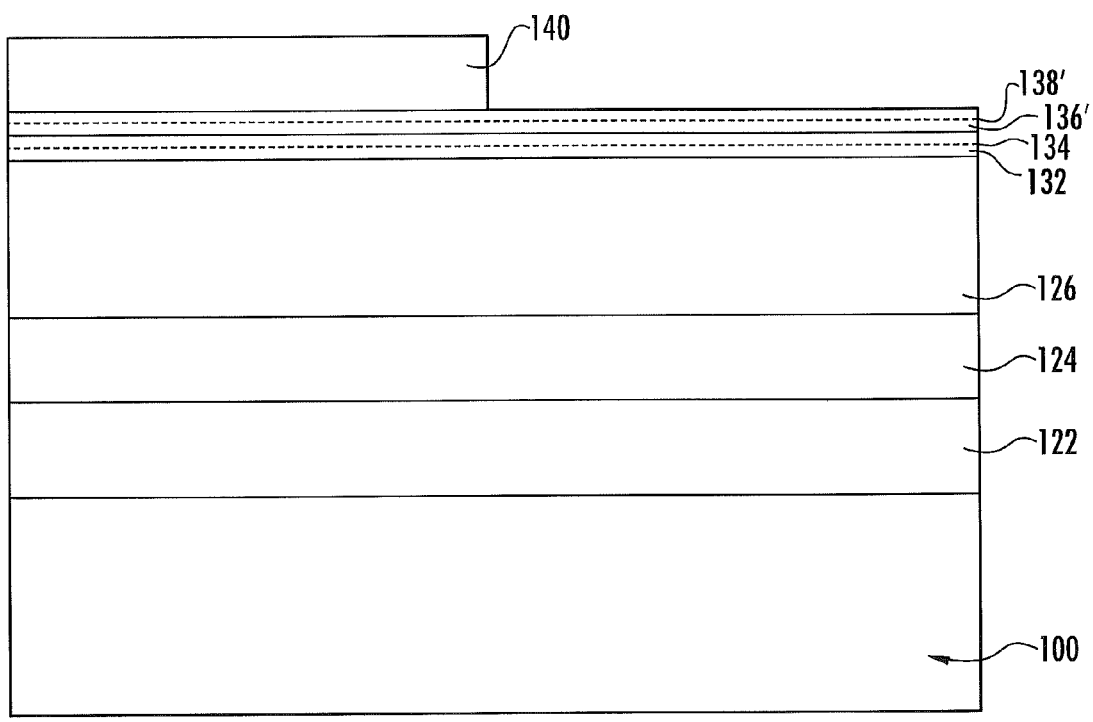
FIGS. 4 to 5 are cross-sectional views illustrating intermediate structures provided by methods of fabricating quantum well field effect transistors according to some embodiments of the present inventive concept.

Referring to FIGS. 2 and 4, the methods may include forming 200 a quantum well layer 126 on the substrate 100. The method may include forming 300 a first barrier layer 132 including a first delta doped layer 134 on the quantum well layer 126. The quantum well layer 126 may include, for example, InSb, GaSb, InGaAs, InAs, GaAs or InGaAsSb.

Prior to forming 200 the quantum well layer 126, a nucleation and buffer layer 122 and a barrier layer 124 may be formed on the substrate 100. The quantum well layer 126, the nucleation and buffer layer 122, and the barrier layer 124 may be formed through any appropriate deposition methods such as, for example, a molecular-beam epitaxy (MBE). The nucleation and buffer layer pattern 122 may include, for example, SiGe or GaAs, and the barrier layer 124 may include, for example, SiGe, GaAs, or AlGaAs.

The first barrier layer 132 including the first delta doped layer 134 may be formed through an epitaxial layer deposition process by temporarily suspending deposition and supplying dopants on a nongrowing epitaxial layer surface. The epitaxial layer deposition process may be, for example, MBE. In some embodiments, the first barrier layer 132 may be formed on an entire underlying structure through a non-selective epitaxial layer deposition process.

The first barrier layer 132 may include, for example, gallium arsenide (GaAs), aluminum arsenide (AlAs), aluminum gallium arsenide (AlGaAs), Indium phosphide (InP), aluminum antimonide (AlSb), aluminum indium antimonide (AlInSb), aluminum indium arsenide (AlInAs), aluminum gallium arsenide antimonide (AlGaAsSb), or aluminum indium arsenide antimonide (AlInAsSb). The first delta doped layer 134 may include, for example, beryllium (Be), carbon (C), silicon (Si), sulfur (S) or tellurium (Te).

For example, in an n-type device the dopants may include, for example, B and/or Te. For a p-type device, the dopants may include, for example, Be and/or C. The thickness of the doping layer will depend on factors such as the type of doping and the materials used.

The method continues with forming 400 a second barrier layer 136 selectively on a portion of the first barrier layer 132. After the second barrier layer 136 is formed, the method continues with forming 500 the first and second quantum well channel structures 102, 104. The first and second barrier layers 132, 136 and the quantum well layer 126 may be patterned to form the first quantum well channel structure 102, and the first barrier layer 132 and the quantum well layer 126 may be patterned to form the second quantum well channel structure 104. The method continues with forming 600 the gate insulating layer 144 and the gate electrode layer 146 on the first and second quantum well channel structures 102, 104.

Referring again to FIG. 1, the isolation layer 110 may be formed before forming 600 the gate insulating layer 144 and the gate electrode layer 146. The isolation layer 110 may be a shallow trench isolation (STI). Upper surfaces of the isolation layer 110 may be disposed lower than upper surfaces of the first and second quantum well channel structures 102, 104 relative to an upper surface of the substrate 100 as in FIG. 1.

Forming 400 the second barrier layer 136 in FIG. 2 may be performed as described in FIGS. 3 to 6.

Figure 3:
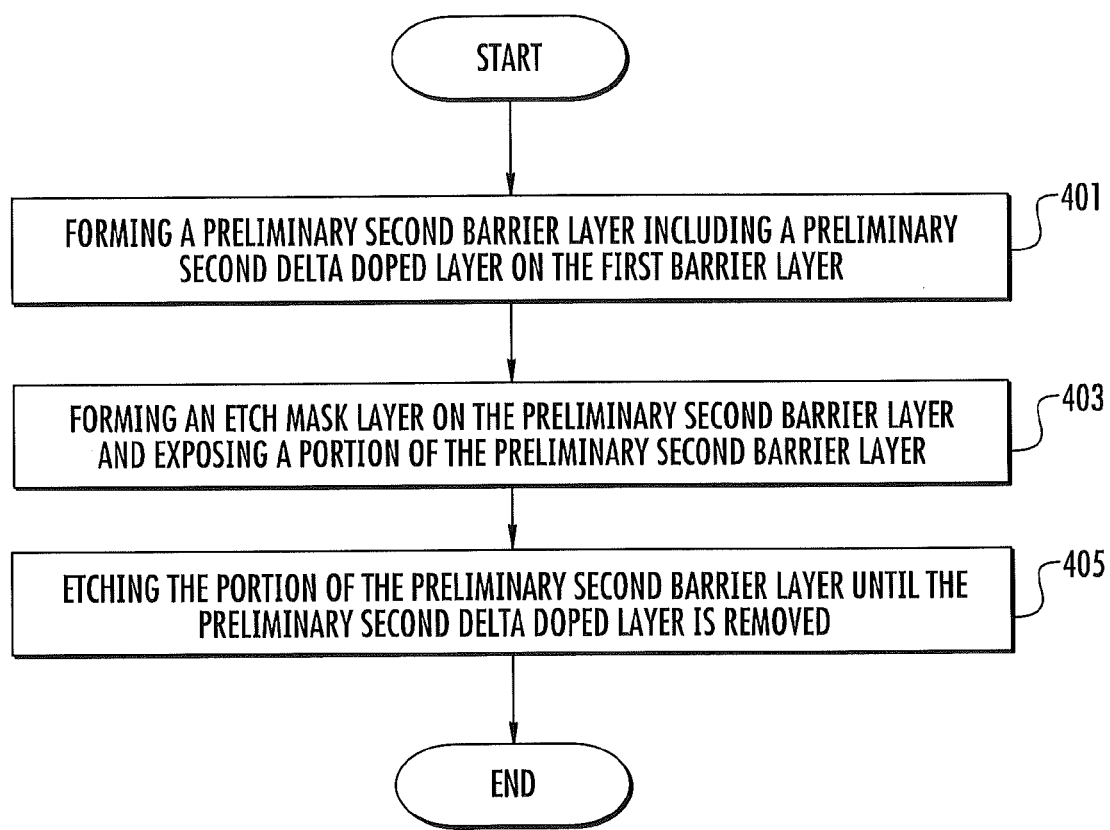

Referring to FIGS. 3 and 4, the method may include forming 401 a preliminary second barrier layer 136' including a preliminary second delta doped layer 138' on the first barrier layer 132 and forming 403 an etch mask layer 140 on the preliminary second barrier layer 136'. The etch mask layer 140 may expose a portion of the preliminary second barrier layer 136'. According to some embodiments, the first barrier layer 132 and the preliminary second barrier layers 136' may be formed through an in-situ deposition process without vacuum break. The in-situ deposition process may be, for example, a molecular-beam epitaxy (MBE). The preliminary second barrier layer 136' may include, for example, GaAs, AlAs, AlGaAs, InP, AlInSb, AlInAs, AlGaAsSb or InAslAsSb. The preliminary second delta doped layer 138' may include, for example, Be, C, Si, S or Te.

Figure 5:
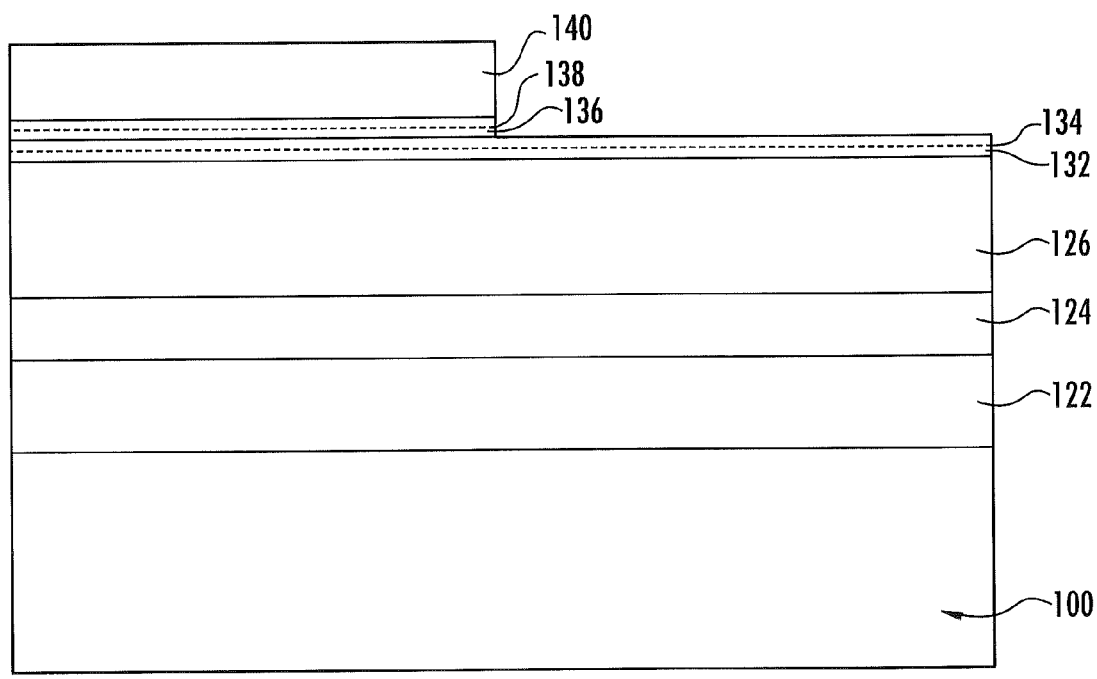

Referring to FIGS. 3 and 5, the method may include etching 405 the portion of the preliminary second barrier layer 136' until the preliminary second delta doped layer is removed. For some embodiments, etching 405 may be performed for a predetermined time. According to the predetermined time, etching 405 may be stopped immediately after or a short time interval after the preliminary second delta doped layer 138' is removed. In some embodiments, etching 405 may be performed until the first barrier layer 132 is exposed as described in FIG. 5. While illustrated as the portion of the preliminary second barrier layer 136' is completely etched until the first barrier layer 132 is exposed, the preliminary second barrier layer 136' may remain on the first barrier layer 132 after etching 405 is performed.

The etch mask layer 140 may be removed after the second barrier layer 136 is formed. The etch mask layer 140 may include any appropriate materials having etch selectivity with respect to the preliminary second barrier layer 136'.

Figure 6:
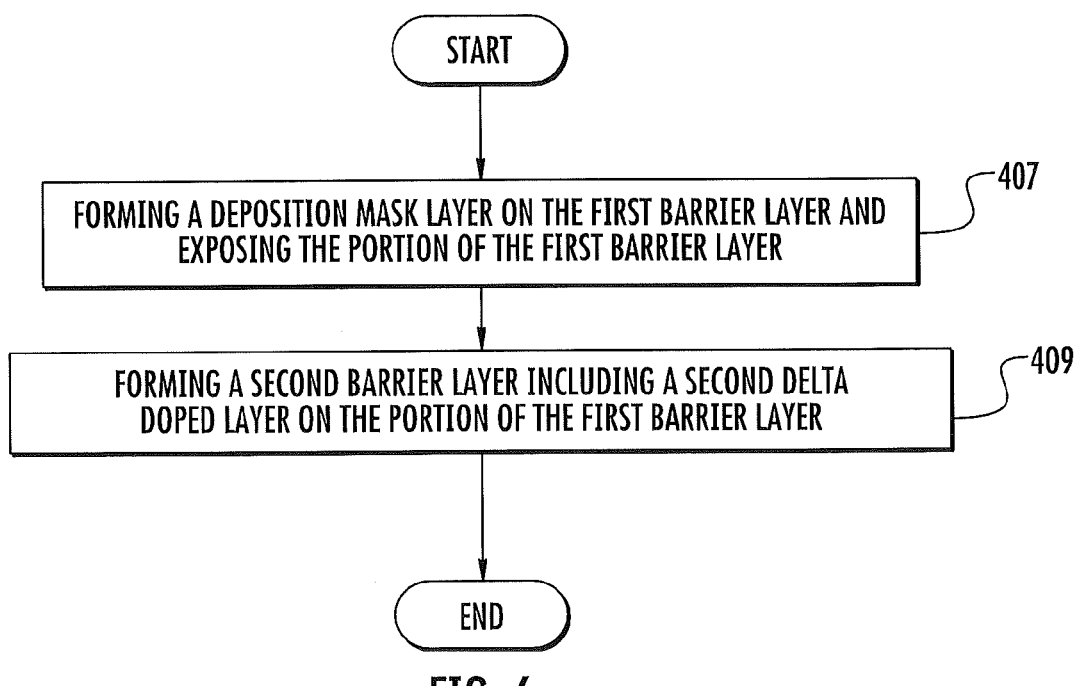
FIG. 6 is a flow chart illustrating methods of fabricating quantum well field effect transistors according to some embodiments of the present inventive concept.
Figure 7:
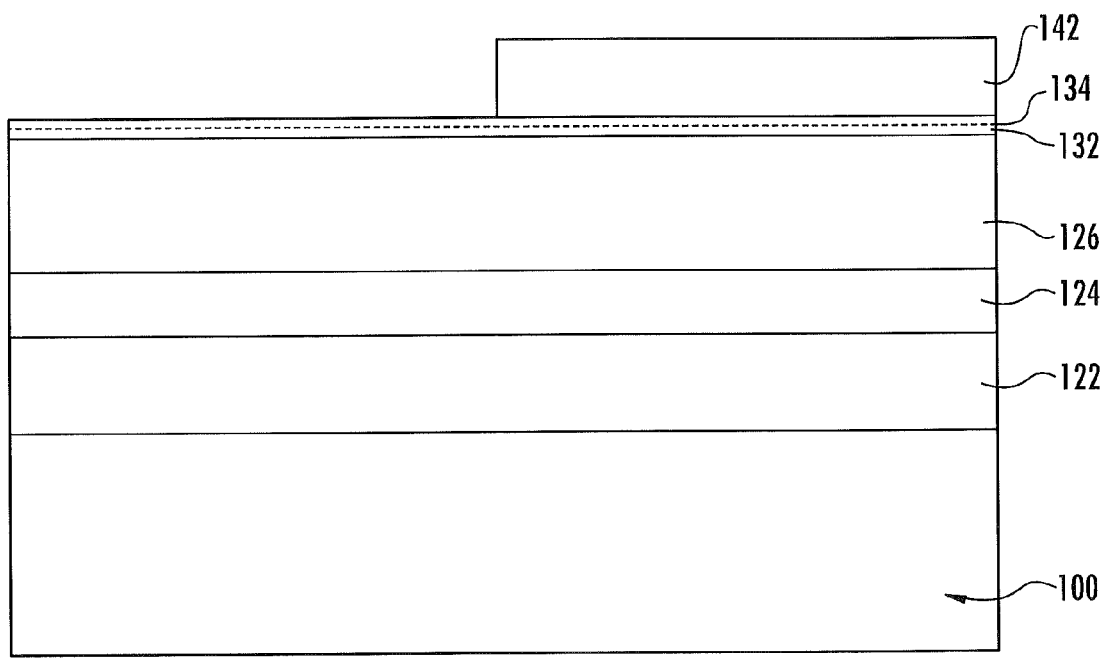
FIGS. 7 and 8 are cross-sectional views illustrating intermediate structures provided methods of fabricating quantum well field effect transistors according to some embodiments of the present inventive concept.
Figure 8:
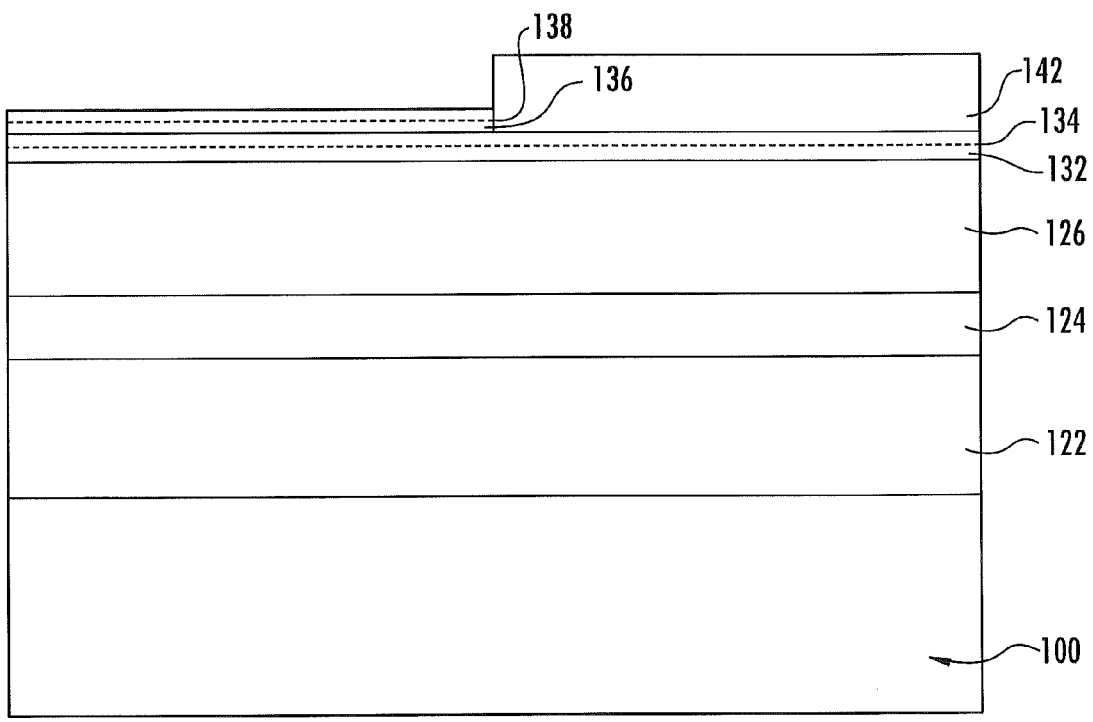

Alternatively, forming 400 the second barrier layer 136 selectively on the portion of the first barrier layer 132 can be performed as described in FIGS. 6 to 8. Referring to FIGS. 6 and 7, the method may include forming 407 a deposition mask layer 142 on the first barrier layer 132. The deposition mask layer 142 may expose the portion of the first barrier layer 132. Referring to FIGS. 6 and 8, the method may include forming 409 the second barrier layer 136 including the second delta doped layer 138 selectively on the portion of the first barrier layer 132. The deposition mask layer 142 may be removed after the second barrier layer 136 is formed. The deposition mask layer 142 may include, for example, polymethyl methacrylate (PMMA).

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to one of ordinary skill in the art to which this invention belongs. In the drawings, the sizes and relative sizes of layers and regions may be exaggerated for clarity. Like reference numbers refer to like elements throughout.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device comprising:
    forming a first barrier layer comprising a first delta doped layer on a quantum well layer that is disposed on a substrate comprising a first region and a second region;
    forming a second barrier layer comprising a second delta doped layer selectively on a portion of the first barrier layer in the first region of the substrate;
    patterning the first and second barrier layers and the quantum well layer to form a first quantum well channel structure in the first region and patterning the first barrier layer and the quantum well layer to form a second quantum well channel structure in the second region, wherein the first quantum well channel structure comprises a first portion of the quantum well layer, a first portion of the first barrier layer and a portion of the second barrier layer that are sequentially stacked on the substrate, and wherein the second quantum well channel structure comprises a second portion of the quantum well layer and a second portion of the first barrier layer that are sequentially stacked on the substrate;
    forming a gate insulating layer on the first and second quantum well channel structures, wherein a first portion of the gate insulating layer covers sides of the first portion of the quantum well layer, the first portion of the first barrier layer and the portion of the second barrier layer and an upper surface of the portion of the second barrier layer, and wherein a second portion of the gate insulating layer covers sides of the second portion of the quantum well layer and the second portion of the first barrier layer and an upper surface of the second portion of the first barrier layer; and
    forming a gate electrode layer on the gate insulating layer.

2. The method of claim 1, wherein the first delta doped layer comprises a first dopant and the second delta doped layer comprises a second dopant, and wherein a first dopant concentration is different from a second dopant concentration.

3. The method of claim 1, further comprising forming a plurality of barrier layers comprising respective ones of a plurality of delta doped layers on the second barrier layer, wherein the first and second quantum well channel structures comprise some of the plurality of barrier layers.

4. The method of claim 1, wherein the quantum well layer comprises indium antimonide (InSb), indium gallium arsenide (InGaAs), indium arsenide (InAs), gallium arsenide (GaAs), gallium antimonide (GaSb), or indium gallium arsenide antimonide (InGaAsSb).

5. The method of claim 1, wherein the first and second barrier layers comprise gallium arsenide (GaAs), aluminum arsenide (AlAs), aluminium gallium arsenide (AlGaAs), Indium phosphide (InP), aluminum antimonide (AlSb), aluminium indium antimonide (AlInSb), aluminium indium arsenide (AlInAs), aluminum gallium arsenide antimonide (AlGaAsSb), or aluminum indium arsenide antimonide (AlInAsSb).

6. The method of claim 1, wherein a thickness of the quantum well layer is 4 to 7 times greater than a thickness of the first barrier layer.

7. The method of claim 1, wherein the first portion of the quantum well layer comprises first opposing sidewalls, and the second portion of the quantum well layer comprises second opposing sidewalls, and
    wherein a distance between the first opposing sidewalls or a distance between the second opposing sidewalls is in a range of about 5 nm to about 20 nm.

8. The method of claim 7, wherein a thickness of the quantum well layer is in a range of about 10 nm to about 40 nm.

9. The method of claim 1, wherein the first quantum well channel structure comprises a channel structure of a first Fin-shaped Field Effect Transistor (FinFET), and the second quantum well channel structure comprises a channel structure of a second FinFET, and
    wherein the gate electrode layer covers the first portion of the gate insulating layer and the second portion of the gate insulating layer.

10. A method of forming an integrated circuit device comprising:
    forming a first quantum well channel structure comprising first opposing sidewalls on a substrate, wherein the first quantum well channel structure comprises a first quantum well layer and a first plurality of barrier layers comprising respective ones of a first plurality of delta doped layers, and wherein the first quantum well layer comprises group III and group V elements and extends between the first plurality of barrier layers and the substrate;
    forming a second quantum well channel structure comprising second opposing sidewalls, wherein the second quantum well channel structure comprises a second quantum well layer and a second plurality of barrier layers comprising respective ones of a second plurality of delta doped layers, wherein the second quantum well layer comprises group III and group V elements and extends between the second plurality of barrier layers and the substrate, and wherein numbers of the barrier layers comprising the first and second plurality of barrier layers are different;
    forming a first gate insulating layer covering sides of the first quantum well layer and the first plurality of barrier layers and an upper surface of an uppermost one of the first plurality of barrier layers;
    forming a second gate insulating layer covering sides of the second quantum well layer and the second plurality of barrier layers and an upper surface of an uppermost one of the second plurality of barrier layers; and
    forming a gate electrode layer on the first gate insulating layer and the second gate insulating layer.

11. The method of claim 10, wherein the first plurality of delta doped layers comprise respective ones of a plurality of dopants and two delta doped layers among the first plurality of delta doped layers have different dopant concentrations.

12. The method of claim 10, a distance between the first opposing sidewalls or a distance between the second opposing sidewalls is in a range of about 5 nm to about 20 nm.

13. The method of claim 12, wherein a thickness of the first quantum well layer is 4 to 7 times greater than a thickness of one of the first plurality of barrier layers.

14. The method of claim 10, wherein the first quantum well channel structure comprises a channel structure of a first Fin-shaped Field Effect Transistor (FinFET), and the second quantum well channel structure comprises a channel structure of a second FinFET, and
    wherein the gate electrode layer covers both of the first opposing sidewalls of the first quantum well channel structure and both of the second opposing sidewalls of the second quantum well channel structure.

15. A method of forming an integrated circuit device comprising:
- forming a quantum well layer comprising group III and group V elements on a substrate;
- forming a first barrier layer comprising a first delta doped layer on the quantum well layer, the quantum well layer extending between the substrate and the first delta doped layer;
- forming a second barrier layer comprising a second delta doped layer on the first barrier layer;
- patterning the first and second barrier layers and the quantum well layer to form a quantum well channel structure, the quantum well channel structure comprising a portion of the quantum well layer, a portion of the first barrier layer and a portion of the second barrier layer that are sequentially stacked on the substrate;
- forming a gate insulating layer covering sides of the portion of the quantum well layer, the portion of the first barrier layer and the portion of the second barrier layer and an upper surface of the portion of the second barrier layer; and
- forming a gate electrode layer on the gate insulating layer.

16. The method of claim 15, wherein the first delta doped layer comprises a first dopant and the second delta doped layer comprises a second dopant, and wherein a first dopant concentration is different from a second dopant concentration.

17. The method of claim 15, wherein the portion of the quantum well layer comprises opposing sidewalls, and
- wherein a distance between the opposing sidewalls of the portion of the quantum well layer is in a range of about 5 nm to about 20 nm.

18. The method of claim 17, wherein a thickness of the portion of the quantum well layer is in a range of about 10 nm to about 40 nm.

19. The method of claim 17, wherein a thickness of the portion of the quantum well layer is 4 to 7 times greater than a thickness of the portion of the first barrier layer.

20. The method of claim 15, wherein the quantum well channel structure comprises a channel structure of a Fin-shaped Field Effect Transistor (FinFET), and
- wherein the gate electrode layer covers both of opposing sidewalls of the quantum well channel structure.

* * * * *